Feb. 17, 1953 W. VAN B. ROBERTS 2,629,025

HIGH GAIN SELECTIVE SIGNAL AMPLIFIER SYSTEM

Filed April 29, 1949

INVENTOR
WALTER VAN B. ROBERTS
BY H. L. Newton
ATTORNEY

Patented Feb. 17, 1953

2,629,025

UNITED STATES PATENT OFFICE 2,629,025

HIGH GAIN SELECTIVE SIGNAL AMPLIFIER SYSTEM

Walter van B. Roberts, Princeton, N. J., assignor to Radio Corporation of America, a corporation of Delaware Application April 29, 1949, Serial No. 90,292

10 Claims. (Cl. 179—171)

Figure 1:
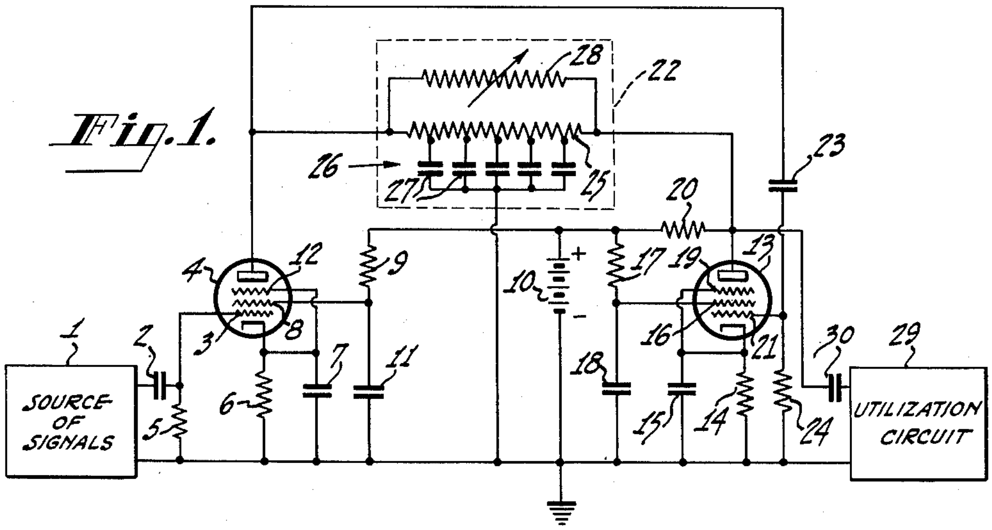

This invention relates to signal amplifiers, and particularly to regenerative signal amplifier systems having both relatively high gain and good selectivity.

Customarily, in order to effect substantial signal amplification, and at the same time to provide good selectivity, there is provided in the output circuit of an amplifier stage, a circuit tuned to the particular band of frequencies to be amplified. Over this band of frequencies, therefore, the tuned circuit provides an impedance of substantial magnitude in the output system of the amplifier, whereby an appreciable signal amplification may be effected. Where it is desired, as in the intermediate frequency amplifier of a superheterodyne receiver, for example, to effect signal amplification over a fixed band of frequencies, the tuning of the output circuit impedance may be fixed. In conventional receivers, such a tuned circuit ordinarily consists of a coil or inductor which is resonated at a desired frequency by capacitance means such as a capacitor, for example.

It is well known that, in amplifiers or amplifier systems of the character described, the use of a coil or equivalent inductive device in the circuits referred to, presents problems arising from mutual coupling effects. Some of these deleterious effects may be eliminated by proper shielding, particularly where circuits other than the amplifier resonant circuits are involved. Also, there recently has been a trend toward the use of so-called printed circuits, wherein certain of the circuit components and conductive connections therefor are suitably impressed or formed upon an insulating baseplate. It has not been feasible up to the present time to fabricate all types of coils by such a process, particularly those having sufficient inductance to enable use thereof at the frequencies ordinarily employed in the intermediate frequency amplifier section of a radio receiver. By reason of numerous disadvantages, including those referred to, resulting from the use of frequency-sensitive circuits including inductors, it is desirable to provide a facility of this character not only for somewhat general use, but also particularly for use in conjunction with high gain selective amplifiers.

Therefore, it is an object of the present invention to provide a novel signal amplifier circuit or system incorporating frequency-sensitive facilities, whereby to effect high signal amplification coupled with good selectivity.

Another object of the invention is to provide a high-gain, selective, signal amplifier employing selective coupling impedance means which does not include an inductive circuit element and which, at the same time, has a required frequency sensitivity to produce a desired selectivity.

Still another object of the invention is to provide a high gain selective signal amplifier which is provided with a signal output circuit having a resistive-capacitive network suitably coupled to produce a relatively high impedance in the output circuit, while at the same time having sufficient frequency sensitivity to provide good selectivity.

A further object of the invention is to provide a frequency-sensitive high impedance load circuit having no inductive devices incorporated therein, whereby it may be adapted for general use, and particularly for use in connection with the output circuit of a signal amplifier.

In accordance with the invention, there is provided a novel, relatively high-impedance, frequency-sensitive load circuit for a signal amplifier stage which includes feedback means coupled between the anode and control grid of an electronic tube, whereby, if steps were not taken to prevent it, the feedback means would be sufficiently regenerative in character to produce sustained oscillations at a predetermined frequency. However, the feedback means may include a facility which is sufficiently degenerative in character to prevent the tube from oscillating.

Further, in accordance with another feature of the invention, the feedback means included in the load circuit for the amplifier stage comprises a regenerative resistive-capacitive branch and a degenerative resistive branch. A source of signal-modulated carrier waves having the predetermined frequency is coupled to the input circuit of the amplifier stage. The output circuit of the amplifier stage is coupled to a predetermined point on the load circuit, and a utilization circuit also is coupled to a predetermined point on the load circuit.

The novel features that are considered characteristic of this invention are set forth with particularity in the appended claims. The invention itself, however, both as to its organization and method of operation, as well as additional objects and advantages thereof, will best be understood from the following description, taken in connection with the accompanying drawing.

Figure 2:
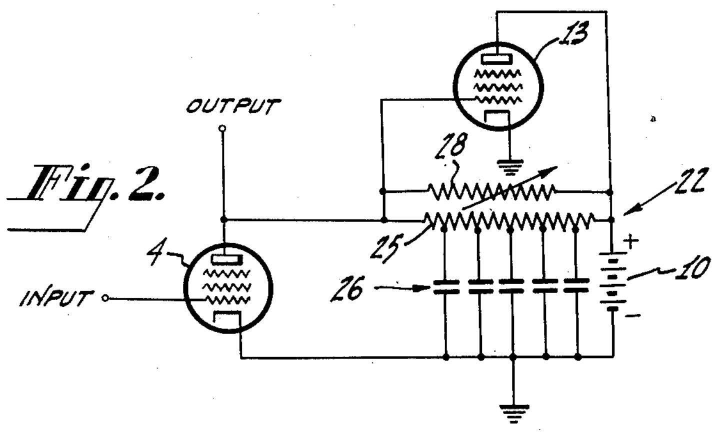

In the drawing:

Figure 1 is a schematic representation of an illustrative embodiment of the invention; and, Figure 2 is a simplified circuit diagram showing an alternative arrangement as a modification of the first embodiment of the invention.

Referring now to Figure 1 of the drawing, there is disclosed a source 1 of signals, which may comprise signal-modulated carrier waves coupled by means of a condenser 2 to the control grid 3 of an electronic tube 4, which may be considered as a first amplifier stage. The coupling circuit also includes a leak resistor 5. A self-biasing resistor 6 is coupled between the cathode of the tube 4 and ground, and is bypassed for alternating currents by a condenser 7. The screen grid 8 of the tube 4 has impressed thereon a suitable positive potential by means of a resistor 9 connected to the positive terminal of a source of unidirectional energy such as a battery 10, and is bypassed to ground by a condenser 11. The suppressor grid 12 is conventionally connected to the cathode. Space current for the tube 4 is provided by means of a connection, to be described, to the anode of the tube.

There also is provided a second electronic tube 13, which may in some respects be considered as a second amplifier stage. The cathode of this tube is grounded through a resistor 14 which is bypassed for alternating currents by a condenser 15, whereby to provide suitable self-biasing for the input circuit of the tube. The screen grid 16 of the tube 13 has impressed thereon a suitable positive potential by means of a resistor 17 connected to the positive terminal of the battery 10, and is bypassed to ground by a condenser 18. The suppressor grid 19 of this tube also is conventionally connected to the cathode. Space current for the tube 13 is provided by a connection of the anode through a relatively low impedance resistor 20 to the positive terminal of the battery 10.

In accordance with one of the features of the present invention, feedback means such as a resistive-capacitive network 22, is coupled between the anode and control grid 21 of the tube 13. This coupling is effected by a condenser 23, for which a resistor 24 is provided as a leak to ground. The network 22 is provided with a regenerative branch comprising a series resistance element 25 and a shunt capacitance element 26. This branch of the network may be constructed in any number of ways, well known to those skilled in the art. For example, the resistance element 25 may consist of a plurality of serially connected resistors, in which case the capacitance element 26 may consist of a plurality of condensers, such as 27, connected respectively to junction points between the series of resistors. Alternatively, as in a preferred embodiment of the invention, this branch of the network 22 may consist of a transmission line having distributed resistance and capacitance. The network additionally includes a degenerative branch comprising a resistor 28, which preferably is adjustable and is connected across the terminals of the resistance element 25.

The network 22 constitutes the major portion of the load impedance for inclusion in the output circuit of the tube 4, and to this end the anode of the tube 4 is coupled to one terminal of the network, substantially as shown. A utilization circuit 29 for the amplifier stage is coupled to a point on the feedback network. As illustrated, this coupling is effected by means of a condenser 30 to the anode of the tube 13.

Referring now to the operation of the illustrated embodiment of the invention, consideration first will be given to the effect of the resistive-capacitive network 22. Neglecting, for the moment, consideration of the shunt resistor 28, and assuming, for example, that this branch of the network is disconnected, it will be understood that the series resistance element 25 and shunt capacitance element 26 are so proportioned as to effect a substantially 180° phase shift between the anode and control grid 21 of the tube 13, so as to effect a regenerative feedback of sufficient energy, and in proper phase, from the anode to the control grid, to effect the production of sustained oscillations by the tube 13 at a predetermined frequency dependent principally upon the values of the series resistance and the shunt capacitance of the network. In the present instance, this frequency should be substantially the same as the carrier frequency derived from the signal source 1.

However, it is not within the purview of the instant invention to effect the generation of oscillations by the tube 13. Such operation is prevented by means of the shunt resistor 28, the effect of which is to provide sufficient degenerative coupling between the anode and the control grid 21 of the tube 13 to produce the desired result. The effect, then, of the network 22 is to provide a relatively high impedance at the predetermined frequency and, at the same time, to provide suitable attenuation of frequencies on either side of the predetermined frequency to provide a band pass characteristic suitable for use as a frequency-sensitive device in an amplifying system. The inclusion of the network 22 as the principal load impedance device in the anode circuit of the tube 4 enables this tube to function in a manner to develop, in its output circuit, signal voltages of sufficiently high magnitude to effect a relatively high gain or amplification in the amplifier.

By making the shunt resistor 28 variable, the frequency sensitivity of the network 22 may be appropriately varied to suit a number of different situations. It has been found that the adjustment of this resistor is not at all critical, and an increase in the value of the resistor will effect a corresponding decrease in the magnitude of the degenerative feedback from the anode to the control grid 21 of the tube 13. The smaller the magnitude of the degenerative feedback, the closer the approach of this tube to the point of oscillation, and the higher the effective impedance of the network 22 is made. However, at the same time, such an adjustment will materially narrow the band of frequencies which will be passed by the amplifier. Conversely, an adjustment of the resistor 28, whereby to decrease its resistance, will produce an impedance which has a smaller effective value and will broaden the pass band of frequencies.

It has been found that, with apparatus constructed substantially in accordance with the foregoing disclosure, very good results were obtained. The adjustment of the resistor 28 is not at all critical in the performance of the amplifier. Consequently, the apparatus may be adjusted by means of this resistor within rather wide limits, to provide the desired pass band of frequencies and also to adjust the gain of the amplifier stage as desired. For example, it has been found that it is well within the capabilities of this amplifying system to provide a gain or amplifiation of over 1600. A signal voltage of the order of 0.003 volt, derived from the source of signals 1, was found to develop an amplified signal of approximately 5 volts at the input terminals of the utilization circuit 29. A gain of this magnitude was obtained, together with a frequency band width of approximately 11 kilocycles, with the center frequency being 624 kilocycles.

It will be appreciated that the invention is susceptible of embodiment in forms other than that specifically shown and described herein. In using a load circuit of the character described including a resistive-capacitive network coupled between the input and output electrodes of an electronic tube as a regenerative feedback which is incapable of producing oscillations, it is essential only to couple the output circuit of the amplifier stage, and also the utilization circuit, to such a load circuit. For example, instead of the utilization circuit 29 being coupled to the anode of the tube 13, as shown, in which case the device operates somewhat in the manner of a two-stage amplifier, this circuit, alternatively, may be coupled to the anode of the tube 4, in which case the device may be considered as a single stage amplifier. Such an arrangement would, of course, result in the sacrifice of some of the potential amplification. Other circuit connections will be apparent to those skilled in the art without departing from the essential attributes of the invention.

Figure 2 illustrates a circuit arrangement wherein the utilization circuit 29 is coupled to the anode of the tube 4. In this figure, also, only the important circuit components have been shown and they have been placed in such positions relative to one another to more clearly bring out the underlying concept that the regenerative resistive-capacitive network 22 for the tube 13, together with this tube, forms the load impedance for the amplifier tube 4.

Accordingly, it is to be understood that the foregoing description of what at present is considered to be a preferred embodiment of the invention is not intended to limit the scope thereof, which is defined in the appended claims, to which reference should be had.

What is claimed is:

1. A high gain selective signal amplifying system, comprising a signal amplifier stage having input and output circuits, a load circuit connected in shunt with said amplifier stage including an electronic tube having an anode, a cathode and a control grid, feedback means comprising a regenerative network having a resistive element thereof serially connected, between said anode and said control grid, a degenerative network shunting said regenerative network, said regenerative network being of a character tending to produce oscillatory operation of said tube at a predetermined frequency, said degenerative network being effective to prevent oscillatory operation of said tube, means for connecting a source of signal-modulated carrier waves having said predetermined frequency to the input circuit of said amplifier stage, means coupling the output of said amplifier stage to said control grid, the space current source for said amplifier stage coupled through said resistance element of said regenerative network, and an impedance element coupling said space current source to the anode of said tube and means for connecting a utilization circuit to said anode.

2. A high gain selective signal amplifying system as defined in claim 1, wherein said regenerative branch is of a resistive-capacitive character and said degenerative branch is of a resistive character.

3. A high gain selective signal amplifying system as defined in claim 1, wherein the output circuit of said amplifier stage is coupled to said control grid and said utilization means.

4. A high gain selective signal amplifying system as defined in claim 1, wherein the output circuit of said amplifier stage and said utilization means both are coupled to the same points on said load circuit.

5. A high gain selective regenerative signal amplifying system, comprising a source of carrier waves of predetermined frequency modulated in amplitude by intelligence signals, a first amplifier tube having an anode, a cathode and a control grid, means coupling said signal source to the control grid of said first amplifier tube, a second amplifier tube having an anode, a cathode and a control grid, a phase shifting network comprising a fixed resistor and a plurality of parallelly arranged condensers spaced along said fixed resistor, a variable resistor connected in shunt with said network, means including a condenser coupling said shunted network between the anode and control grid of said second amplifier tube, a source of space currents for said tubes, a load resistor coupling said source of space current to the anode of said second amplifier tube, means including said variable resistor to vary the tendency of said second amplifier tube to oscillate, means including said shunted network coupling said source of space current to the anode of said first amplifier tube, and a utilization circuit coupled to the anode of said first amplifier tube.

6. A high gain selective signal amplifying system, comprising a signal amplifying electronic tube having an anode, a cathode and a control grid, means for coupling a source of carrier frequency signals to be amplified between the control grid and cathode of said signal amplifying tube, an auxiliary electronic tube having an anode, a cathode and a control grid, a regenerative resistive-capacitive network comprising a resistor connected between the anode and control grid of said auxiliary tube and a plurality of spaced, parallelly arranged capacitors distributed along said resistor, the properties of said network being such that if acting alone it would produce sustained oscillations in the output circuit of said auxiliary tube at a frequency dependent upon the values of the resistance and capacitance of said network and equal substantially to the carrier frequency derived from said source of signals, a degenerative conductive impedance device connected in parallel with the resistor of said regenerative network to maintain said auxiliary tube below the point of oscillation, a source of space current for said tubes, resistance means coupling said source of space current to the anode of said auxiliary tube, means including said regenerative network and said degenerative impedance device coupling said source of space current to the anode of said amplifier tube, and means for connecting a utilization circuit to a point on said network.

7. A high gain selective signal amplifying system, comprising a signal amplifying electronic tube having an anode, a cathode and a control grid, means for coupling a source carrier frequency signals to be amplified to the control grid of said signal amplifying tube, an auxiliary electronic tube having an anode, a cathode and a control grid, a regenerative network having distributed series resistance and shunt capacitance coupled between the anode and control grid of said auxiliary tube, the properties of said network being such that if acting alone it would produce sustained oscillations in the output circuit of said auxiliary tube at a frequency dependent upon the values of said series resistance and shunt capacitance and equal substantially to the carrier frequency derived from said source of signals, a variable resistor connected in parallel with the series resistance portion of said network to maintain said auxiliary tube below the point of oscillation, a source of space current for said tubes, a load impedance device coupling said source of space current to the anode of said auxiliary tube, said regenerative network and said variable resistor coupling said source of space current to the anode of said signal amplifying tube, and terminals for coupling a utilization circuit to the anode of one of said tubes.

8. A high gain selective signal amplifying system, comprising a source of amplitude-modulated carrier frequency signals to be amplified, a signal amplifying electronic tube having an anode, a cathode and a control grid, means coupling said signal source to the control grid of said signal amplifying tube, an auxiliary electronic tube having an anode, a cathode and a control grid, a transmission line having distributed resistance and capacitance coupled between the anode and control grid of said auxiliary tube, the properties of said line being such that if acting alone it would produce sustained oscillations in the output circuit of said auxiliary tube at a frequency dependent upon the values of said distributed resistance and capacitance and equal substantially to the carrier frequency derived from said source of signals, a degenerative resistor connected in parallel with said transmission line to maintain said auxiliary tube below the point of oscillation, a source of space current for said tubes, means including a load resistor coupling said source of space current to the anode of said auxiliary tube, means including said transmission line and said degenerative resistor coupling said source of space current to the anode of said signal amplifying tube, and a utilization circuit coupled to the anode of said auxiliary tube.

9. A high gain selective signal amplifying system, comprising a source of amplitude-modulated carrier frequency signals to be amplified, a signal amplifying electronic tube having an anode, a cathode and a control grid, means coupling said signal source to the control grid of said signal amplifying tube, an auxiliary electronic tube having an anode, a cathode and a control grid, a transmission line having distributed series resistance and distributed shunt capacitances coupled between the anode and control grid of said auxiliary tube, the properties of said line being such that if acting alone it would produce sustained oscillations in the output circuit of said auxiliary tube at a frequency dependent upon the values of the distributed resistance and capacitance of said line and equal substantially to the carrier frequency derived from said source of signals, a degenerative resistor connected in parallel with said transmission line to maintain said auxiliary tube below the point of oscillation, said resistor being variable to vary the selectivity of said amplifier, a source of space current for said tubes, means including a load resistor of relatively small value coupling said source of space current to the anode of said auxiliary tube, means including said transmission line and said degenerative resistor coupling said source of space current to the anode of said signal amplifying tube, and a utilization circuit coupled to the anode of said auxiliary tube.

10. In a high gain selective signal amplifying system, a relatively high impedance load connected in the output circuit of a signal amplifying electronic tube and comprising a transmission line having distributed resistance and capacitance capable of effecting a substantially 180° phase shift between energy impressed upon one terminal and energy derived from the other terminal thereof, an auxiliary electronc tube having an anode, a cathode and a control grid, a source of space current, resistor means coupling said source of space current to the anode of said auxiliary tube, means coupling the terminals of said transmission line respectively to said anode and said control grid, said transmission line coupling said source of space current to said signal amplifying tube, the effect of said transmission line alone being sufficiently regenerative to produce sustained oscillations at a predetermined frequency, a variable resistor shunting said transmission line to produce a sufficient degenerative effect to prevent said auxiliary tube from producing oscillations.

WALTER VAN B. ROBERTS.

REFERENCES CITED

The following references are of record in the file of this patent:

UNITED STATES PATENTS

| Number | Name | Date |
|---|---|---|
| 2,173,427 | Scott | Sept. 19, 1939 |
| 2,344,618 | Koch | Mar. 21, 1944 |
| 2,359,504 | Baldwin | Oct. 3, 1944 |
| 2,372,419 | Ford et al. | Mar. 27, 1945 |
| 2,439,245 | Dunn | Apr. 6, 1948 |